United States Patent [19]
Edo

[11] Patent Number: 5,487,042
[45] Date of Patent: Jan. 23, 1996

[54] SEMICONDUCTOR INTEGRATED CIRCUIT DEVICE EQUIPPED WITH ANSWER SYSTEM FOR TEACHING OPTIONAL FUNCTIONS TO DIAGNOSTIC SYSTEM

[75] Inventor: Yasuhiro Edo, Tokyo, Japan

[73] Assignee: NEC Corporation, Tokyo, Japan

[21] Appl. No.: 205,101

[22] Filed: Mar. 3, 1994

[30] Foreign Application Priority Data

Mar. 4, 1993 [JP] Japan .................................. 5-043435

[51] Int. Cl.⁶ .................................................. G11G 7/00
[52] U.S. Cl. ......................... 365/201; 371/21.1; 371/21.2
[58] Field of Search ................................. 371/21.1, 21.2; 365/201

[56] References Cited

U.S. PATENT DOCUMENTS 4,951,254 8/1990 Ontrop et al. ...................... 371/21.1

Primary Examiner—Do Hyun Yoo
Assistant Examiner—F. Niranjan
Attorney, Agent, or Firm—Sughrue, Mion, Zinn, Macpeak & Seas

[57] ABSTRACT

An answer system incorporated in a dynamic random access memory device informs user's options to a diagnostic system in a diagnostic mode, and allows the diagnostic system to automatically proceed to appropriate test programs stored therein, thereby causing the test programs to be shared between different models of the dynamic random access memory device.

6 Claims, 7 Drawing Sheets

SEMICONDUCTOR INTEGRATED CIRCUIT DEVICE EQUIPPED WITH ANSWER SYSTEM FOR TEACHING OPTIONAL FUNCTIONS TO DIAGNOSTIC SYSTEM

FIELD OF THE INVENTION

This invention relates to a semiconductor integrated circuit device and, more particularly, to a semiconductor integrated circuit device equipped with an answer system for teaching optional functions to a diagnostic system.

DESCRIPTION OF THE RELATED ART

A semiconductor integrated circuit device such as a dynamic random access memory device has a wide variety of optional functions such as a high-speed page mode, a nibble mode and a static column mode, and the manufacturer tries to increase the optional functions for standing at advantage over other semiconductor manufacturer. The new functions are, by way of example, an optional refresh cycle time, an optional power voltage and different parallel input/output bits. In fact, those optional functions result in tens to hundreds different models sharing a fundamental circuit arrangement.

The manufacturer carries out inspections for the products before delivery to a customer so as to guarantee the device characteristics listed in the specification. The inspections are computerized, and a diagnostic system sequentially executes test sequences for the products. However, the optional functions require respective test sequences, and, for this reason, the manufacturer needs to prepare individual test programs for the different models. This results in a large amount of time and labor for not only preparation of these test programs but also management of the test sequences.

SUMMARY OF THE INVENTION

It is therefore an important object of the present invention to provide a semiconductor integrated circuit device which allows a manufacturer to easily examine optional functions.

To accomplish the object, the present invention proposes to answer a diagnostic system a function thereof for allowing the diagnostic system to branch to an appropriate testing program stored in the library.

In accordance with the present invention, there is provided a semiconductor integrated circuit device fabricated on a single semiconductor chip and selectively entering into a standard mode and a diagnostic mode, comprising: a) a main functional circuitry for achieving tasks through one of optional sub-modes of the standard mode of operation selected by a user, the main functional circuitry being subjected to a test operation in the diagnostic mode; b) a signal source operative to fix mode signals respectively indicative of the optional sub-modes of operation selectively to an active level representative of selection of the user and an inactive level representative of non-selection of the user, the mode signal of the active level establishing the optional sub-mode selected by the user in the main functional circuitry; and c) an answer system enabled in the diagnostic mode, and responsive to an inquiry signal from a diagnostic system for sequentially supplying the mode signals to the diagnostic system.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
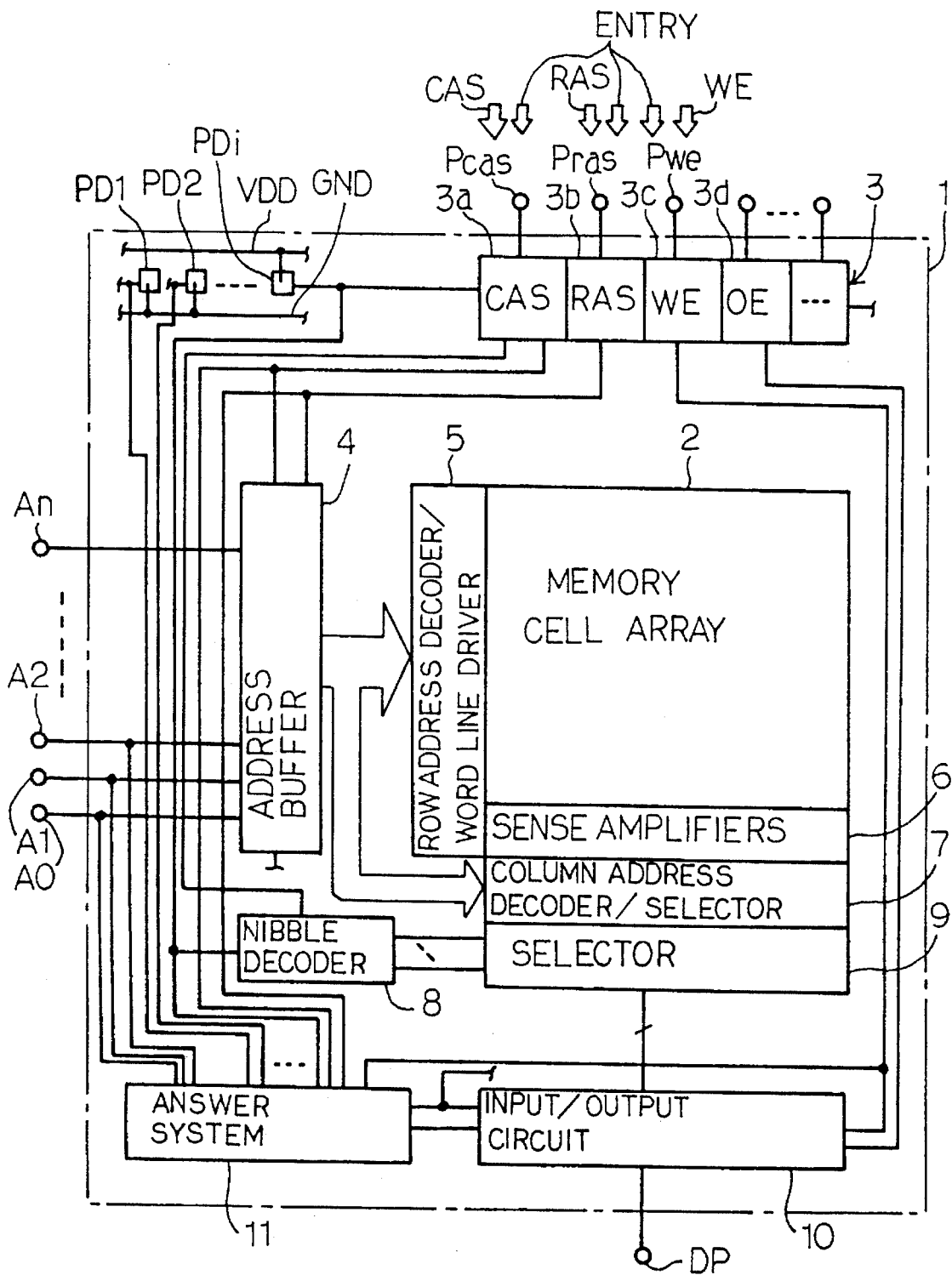
FIG. 1 is a circuit diagram showing the arrangement of a dynamic random access memory device according to the present invention.

Referring first to FIG. 1 of the drawings, a dynamic random access memory device embodying the present invention is fabricated on a single semiconductor chip 1, and is operative in nibble access mode. Although user has an option in the dynamic random access memory device between a standard data access mode, the nibble access mode, a static column access mode, a write per bit mode, the number of input data pins, the power voltage levels and so forth, the dynamic random access memory device shown in FIG. 1 only selects the nibble mode. As a result, the dynamic random access memory device selectively enters into the nibble access mode, a write-in mode, a refresh mode and a diagnostic mode. In the following description, the high voltage level and the low voltage level are assumed to be equivalent to logic "1" level and logic "0" level, respectively.

The dynamic random access memory device embodying the present invention comprises a memory cell array 2 implemented by one-transistor one-capacitor type memory cells, and the memory cells store data bits in a rewritable manner.

The dynamic random access memory device embodying the present invention further comprises a control signal buffer unit 3 having control signal buffer circuits 3a, 3b and 3c respectively assigned a column address strobe signal CAS, a row address strobe signal RAS and a write enable signal WE. The column address strobe signal CAS, the row address strobe signal RAS and the write enable signal WE are supplied from an external device such as, for example, a microprocessor (not shown) through external control pins Pcas, Pras and Pwe to the control signal buffer circuits 3a to 3c in the nibble access mode and the write-in mode, and a three-bit test mode entry signal ENTRY is also stored in the control signal buffer circuits 3a to 3c in the diagnostic mode carried out before delivery to the user. Another control signal buffer circuit 3d is assigned to an output enable signal OE, and the output enable signal OE is supplied from the external device in the nibble access mode and from a diagnostic system 12 (see FIG. 3) in the diagnostic mode.

The control signal buffer circuit 3a produces an internal column address strobe signal and a nibble control signal, and the control signal buffer circuits 3b and 3c produce an internal row address strobe signal and an internal write enable signal.

The dynamic random access memory device embodying the present invention further comprises a plurality of idle pads PD1, PD2 to PDi. The idle pads PD1 to PDi are not connected with a pin, but are selectively coupled with a positive power voltage line VDD and a ground voltage line GND. In detail, user has the options in the dynamic random access memory device, and the manufacturer produces mode signals indicative of the selected optional functions by coupling the idle pads PD1 to PDi with the positive power voltage line VDD. In this instance, the idle pads PD1, PD2 and PDi are respectively assigned to the static column mode, the write per bit mode and the nibble mode, and only the idle pad PDi is coupled with the positive power voltage line VDD on the basis of user's option. As a result, the idle pad PD1 produces a mode signal MODENBL of the active high voltage level indicative of the nibble access mode, and the idle pads PD1 and PD2 keep a mode signal MODESTC indicative of the static column access mode and a mode signal MODEWPB indicative of the write per bit mode in the inactive low voltage level. Although other idle pads (not shown) are further assigned the other options in the number of input bits, in the refresh cycle time and in the power voltage level, these idle pads keep mode signals MODEX1, MODE3V and MODE4K in the inactive low voltage level in this instance.

The mode signal MODENBL is supplied to the control signal buffer circuit 3a, and allows the control signal buffer circuit 3a not only to produce the internal column address strobe signal but also to toggle the column address strobe signal CAS for producing the nibble control signal in the nibble access mode.

The dynamic random access memory device embodying the present invention further comprises an address buffer circuit 4 coupled with address pins A0, A1, A2, . . . and An. The address buffer circuit 4 is responsive to the internal row address strobe signal for producing row address predecoded signals from a row address signal at the address pins A0 to An in the nibble access mode, and is further responsive to the internal column address strobe signal for producing column address predecoded signals from a column address signal at the address pins A0 to An. However, the address buffer circuit 4 is disabled in an answer sub-mode of the diagnostic mode as will be described hereinlater.

The dynamic random access memory device embodying the present invention further comprises a row address decoder/word line driver unit 5. The row address decoder/word line driver unit 5 is responsive to the row address predecoded signals for selectively energizing word lines (not shown), and an energized word line makes memory cells of the memory cell array 2 accessible. The selected memory cells produce potential differences on bit line pairs (not shown).

The dynamic random access memory device embodying the present invention further comprises sense amplifiers 6 coupled with the bit line pairs, and the sense amplifiers 6 increase or develop the potential differences.

The dynamic random access memory device embodying the present invention further comprises a column address decoder/selector unit 7 responsive to the column address predecoded signals. The column address decoder/selector unit 7 allows four potential differences indicative of four data bits read out from the memory cell array 2 to pass therethrough.

The dynamic random access memory device embodying the present invention further comprises a nibble decoder 8, a selector 9 and an input and output circuit 10. The nibble decoder 8 is enabled with the mode signal MODENBL, and is responsive to the nibble control signal so as to cause the selector 9 to sequentially transfer the four data bits to the input and output circuit 10. An input data bit is supplied from an input/output data pin DP to the input/output circuit 10 in the write-in mode, and the four data bits are sequentially supplied from the input/output circuit 10 to the input/output data pin DP in the nibble access mode.

In this instance, the memory cell array 2, the control signal buffer unit 3, the address buffer circuit 4, the row address decoder/word line driver unit 5, the sense amplifiers 6, the column address decoder/selector unit 7, the nibble decoder 8, a selector 9 and an input and output circuit 10 form parts of a main functional circuitry. The sense amplifiers 6 and the input and output circuit 10 form parts of a data propagating system coupled between the memory cell array 2 and the input and output data pin DP, and the address buffer 4, the row address decoder/word line driver unit 5, the column address decoder/selector unit 7 as a whole constitute an addressing system. The data propagation system cooperates with the addressing system and the nibble accessing means for transferring data bits between the memory cell array 2 and the input and output data pin DP.

Moreover, the idle pads PD1 to PDi selectively coupled with the positive power voltage line VDd and the ground voltage line GND as a whole constitute a signal source, and the combinations of user's options and/or standard functions define optional sub-modes of operation. For example, the nibble access mode, the standard refresh cycle time, the single data input/output pin DP, a standard power voltage and the other standard selections form an optional sub-mode of operation, and, accordingly, the mode signal MODENBL serves as a mode signal of an active level. However, if another dynamic random access memory device is accessible through a static column access mode under an optional power voltage level, the mode signals indicative of these options are fixed to the active high voltage level, and as a whole serve as the mode signal of the active level for defining the optional sub-mode.

The dynamic random access memory device embodying the present invention further comprises an answer system 11. The answer system 11 is activated in the diagnostic mode, and informs the diagnostic system 12 of user's options.

Figure 2A:
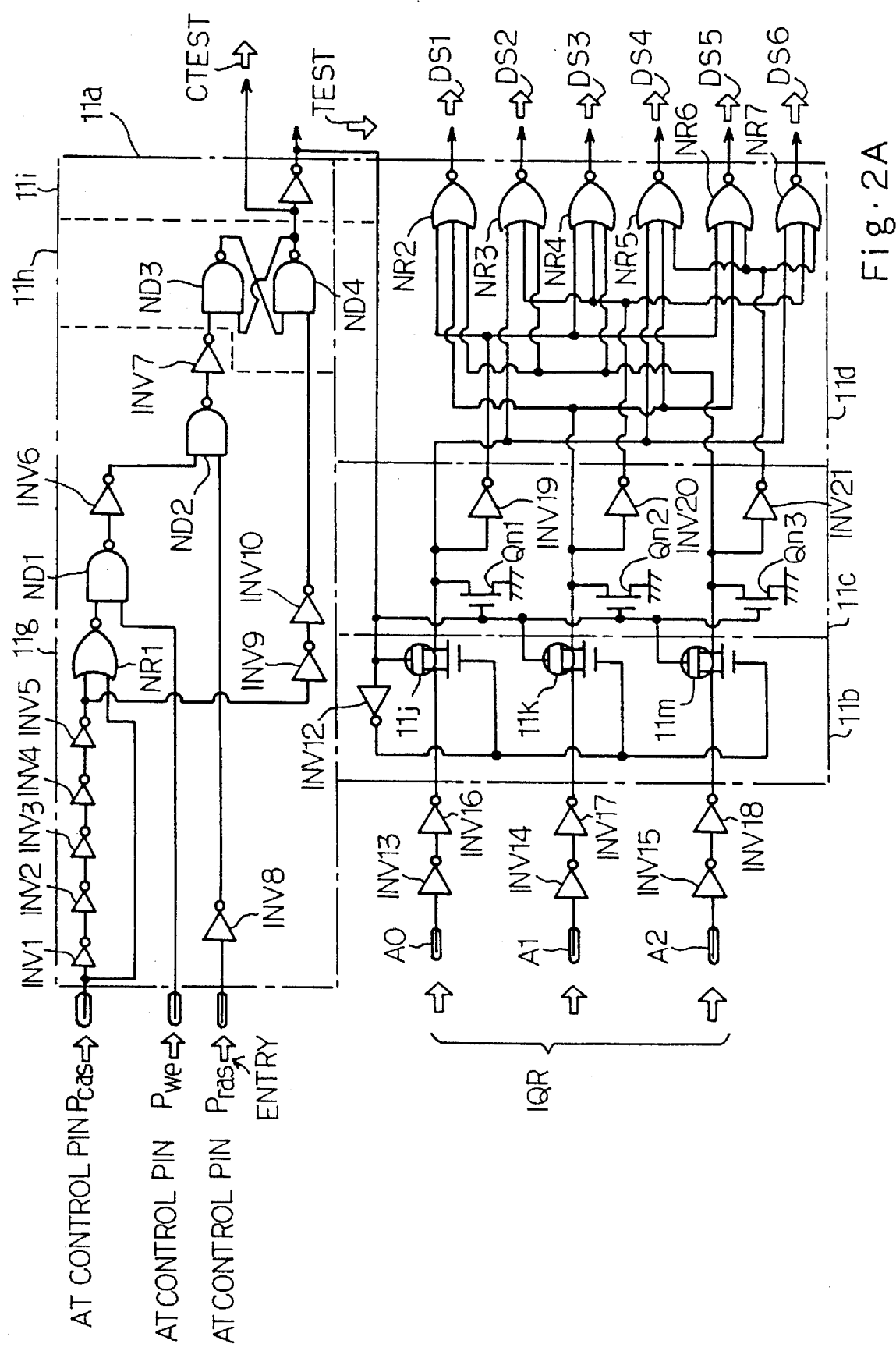
FIGS. 2A and 2B, are circuit diagrams showing the arrangement of an answer system incorporated in the dynamic random access memory device shown in FIG. 1.
Figure 2B:
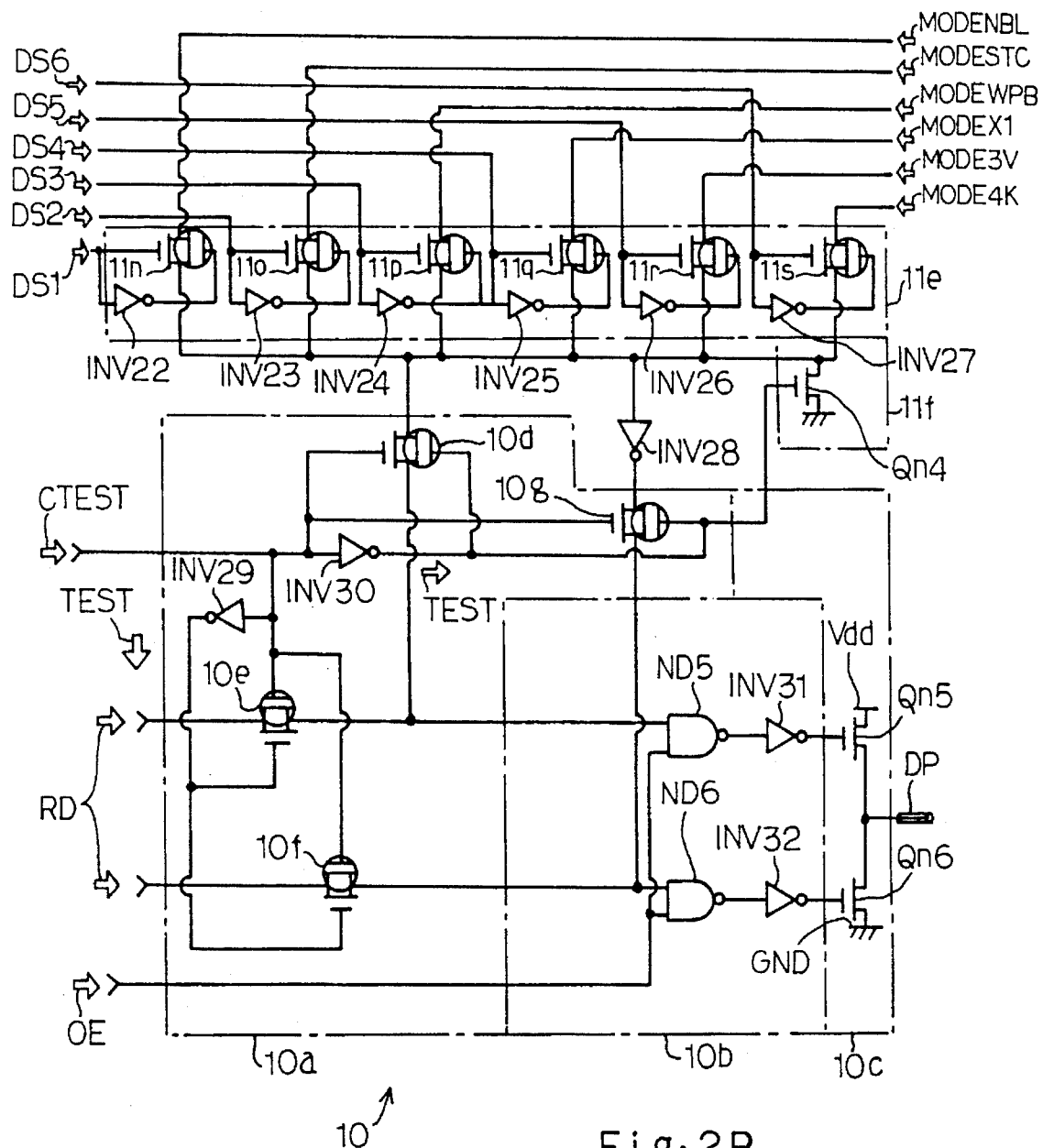

The arrangement of the answer system 11 is illustrated in FIGS. 2A and 2B in detail. The answer system 11 largely comprises a discriminating circuit 11a, a transfer circuit 11b, a reset circuit 11c, a decoding circuit 11d, a selecting circuit 11e and a pull-down circuit 11f, and is communicable with the diagnostic system 12. When the diagnostic system 12 supplies the three-bit test mode entry signal ENTRY to the discriminating circuit 11a, the discriminating circuit 11a acknowledges the answer sub-mode for supplying a test signal TEST to the transfer circuit 11b and the input and output circuit 10. While the transfer circuit 11b is enabled, the decoding circuit 11d decodes inquiry bits IQR, and decoded signals DS1 to DS6 allow the selecting circuit 11e to transfer the mode signals MODENBL, MODESTC, MODEWPB, MODEX1, MODE3V and MODE4K to the input and output circuit 10.

In detail, the discriminating circuit 11a comprises a logic circuit 11g responsive to the three-bit test mode entry signal ENTRY for producing an acknowledge signal, a flip-flop circuit 11h for storing the acknowledge signal and an output inverter 11i for producing the test mode signal TEST from the acknowledge signal. The logic circuit 11g is implemented by ten inverters INV1 to INV10, a NOR gate NR1 and two NAND gates ND1 and ND2, and two NAND gates ND3 and ND4.

The transfer circuit 11b comprises transfer gates 11j, 11k and 11m and an inverter INV12, and the transfer gates 11j to 11m are coupled through inverters INV13 to INV18 to the transfer gates 11j to 11m. The output inverter 11i is coupled with the inverter INV12, and the inverter produces the complementary test mode signal CTEST.

The reset circuit 11c comprises n-channel enhancement type switching transistors Qn1, Qn2 and Qn3 coupled between the output nodes of the transfer gates 11j to 11m and the ground voltage line GND, and inverters INV19 to INV21 coupled with the output nodes of the transfer gates 11j to 11m.

While the test mode signal TEST is in the inactive high voltage level, The transfer gates 11j to 11m are turned off, and the n-channel enhancement type switching transistors Qn1 to Qn3 are turned on. The n-channel enhancement type switching transistors Qn1 to Qn3 produce logic "0" levels, and, accordingly, the inverters yield reset signals of logic "1" level. The reset signals are distributed to the decoding circuit 11d, and reset the decoding circuit 11d so as to change all the decoded signals DS1 to DS6 to the inactive low voltage level.

On the other hand, if the test mode signal TEST is changed to the active low voltage level, the transfer gates 11j to 11m turn on, and the n-channel enhancement type switching transistors Qn1 to Qn3 turn off. AS a result, the reset signal is changed to the inactive low voltage level, and the three-bit inquiry signal IQR is transferred to the decoding circuit 11d.

The decoding circuit 11d comprises NOR gates NR2 to NR7, and the transfer circuit 11b supplies the three bits of the inquiry signal EQR and the complementary bits to the NOR gates NR2 to NR7 in the presence of the test mode signal TEST of the active low voltage level. The decoding circuit 11d shifts one of the decoded signals DS1 to DS6 to the active high voltage level.

The selecting circuit 11e comprises transfer gates 11n to 11s and inverters INV22 to INV27, and the mode signals MODENBL to MODE4K are supplied to the transfer gates 11n to 11s. The inverters INV22 to INV27 produce the complementary decoded signals, and the decoded signals DS1 to DS6 and the complementary decoded signals are supplied the transfer gates 11n to 11s, and one of the mode signals MODENBL to MODE4K is transferred directly to the input and output circuit 10 and through an inverter INV28 to the input and output circuit 10.

The pull-down circuit 11f is implemented by an n-channel enhancement type switching transistor Qn4, and the test mode signal TEST is supplied to the gate electrode of the n-channel enhancement type switching transistor Qn4. While the test mode signal TEST is in the active low voltage level, the n-channel enhancement type switching transistor Qn4 is turned off, and the output node of the selecting circuit 11e is isolated from the ground voltage line. However, if the test mode signal TEST is shifted to the inactive high voltage level, the n-channel enhancement type switching transistor Qn4 turns on, and the pull-down circuit 11f pulls down the output node of the selecting circuit 11e to the ground voltage level.

The input and output circuit 10 comprises a selecting circuit 10a, a logic circuit 10b and an output inverter 10c. The selecting circuit 10a has four transfer gates 10d, 10e, 10f and 10g and two inverters INV29 and INV30, and the inverters INV29 and INV30 restore the test mode signal TEST from the complementary signal CTEST thereof.

While the test mode signal TEST is in the inactive high voltage level, the transfer gates 10e and 10f turn on, and the transfer gate 10d and 10g turn off. As a result, the four potential differences respectively indicative of read-out data bits RD are sequentially transferred from the selector 9 to the logic circuit 10b, and the input and output circuit 10 is isolated from the selecting circuit 11e and the inverter INV28. On the other hand, if the test mode signal TEST goes down to the active low voltage level, the transfer gates 10d and 10g couples the selecting circuit 11e and the inverter INV28 to the logic circuit 10b, and the transfer gates 10e and 10f block the logic circuit 10b from the read-out data bits RD.

The logic circuit 10b is implemented by two series combinations of NAND gates ND5/ND6 and inverters INV31/INV32, and n-channel enhancement type switching transistors Qn5 and Qn6 form in combination the output inverter 10c. The NAND gates ND5 and ND6 are enabled with an output enable signal OE supplied from one of the control signal buffer unit 3, and are responsive to the potential difference indicative of the read-out data bit RD or of the mode signal for gating the switching transistors Qn5 and Qn6. Namely, if the test mode signal TEST is in the inactive high voltage level, the potential difference indicative of the read-out data bit RD is supplied to the NAND gates ND5 and ND6, and the NAND gates ND5 and ND6 cause the inverters INV31 and INV32 to complementarily switch the n-channel enhancement type switching transistors Qn5 and Qn6. On the other hand, if the test mode signal TEST goes down to the active low voltage level, the potential difference indicative of either mode signal MODENBL, MODESTC, MODEWPB, MODEX1, MODE3V or MODE4K reaches the NAND gates ND5 and ND6, and cause the inverters INV31 and INV32 to selectively switch the n-channel enhancement type switching transistors Qn5 and Qn6. An answer signal ASW is supplied from the input and output data pin DP to the diagnostic system 12.

Figure 3:
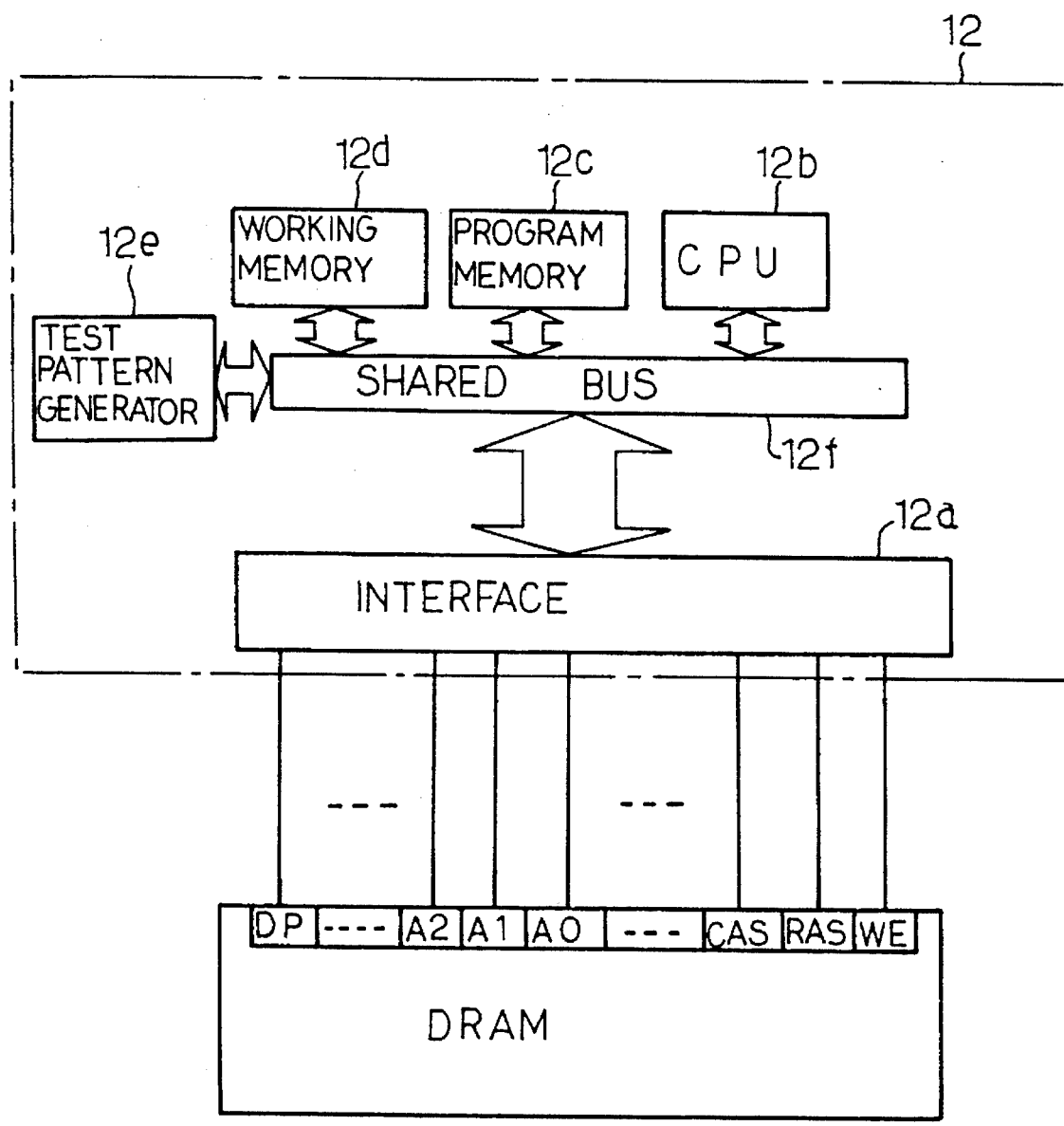
FIG. 3 is a block diagram showing the dynamic random access memory device coupled with a diagnostic system.

Description is hereinbelow made on a program sequence in the answer sub-mode. In the diagnostic mode, the dynamic random access memory device is coupled with the diagnostic system 12 as shown in FIG. 3. The diagnostic system 12 comprises at least an interface 12a, a central processing unit 12b, a program memory 12c, a working memory 12d, a test pattern generator 12e and a shared bus system 12f, and carries out various test operations on the dynamic random access memory device. The program memory 12c stores various program sequences for the test operations and an inquiry sub-routine, and the central processing unit 12b firstly executes the inquiry sub-routine to determine what test operations the dynamic random access memory device has to be subjected to.

Figure 4:
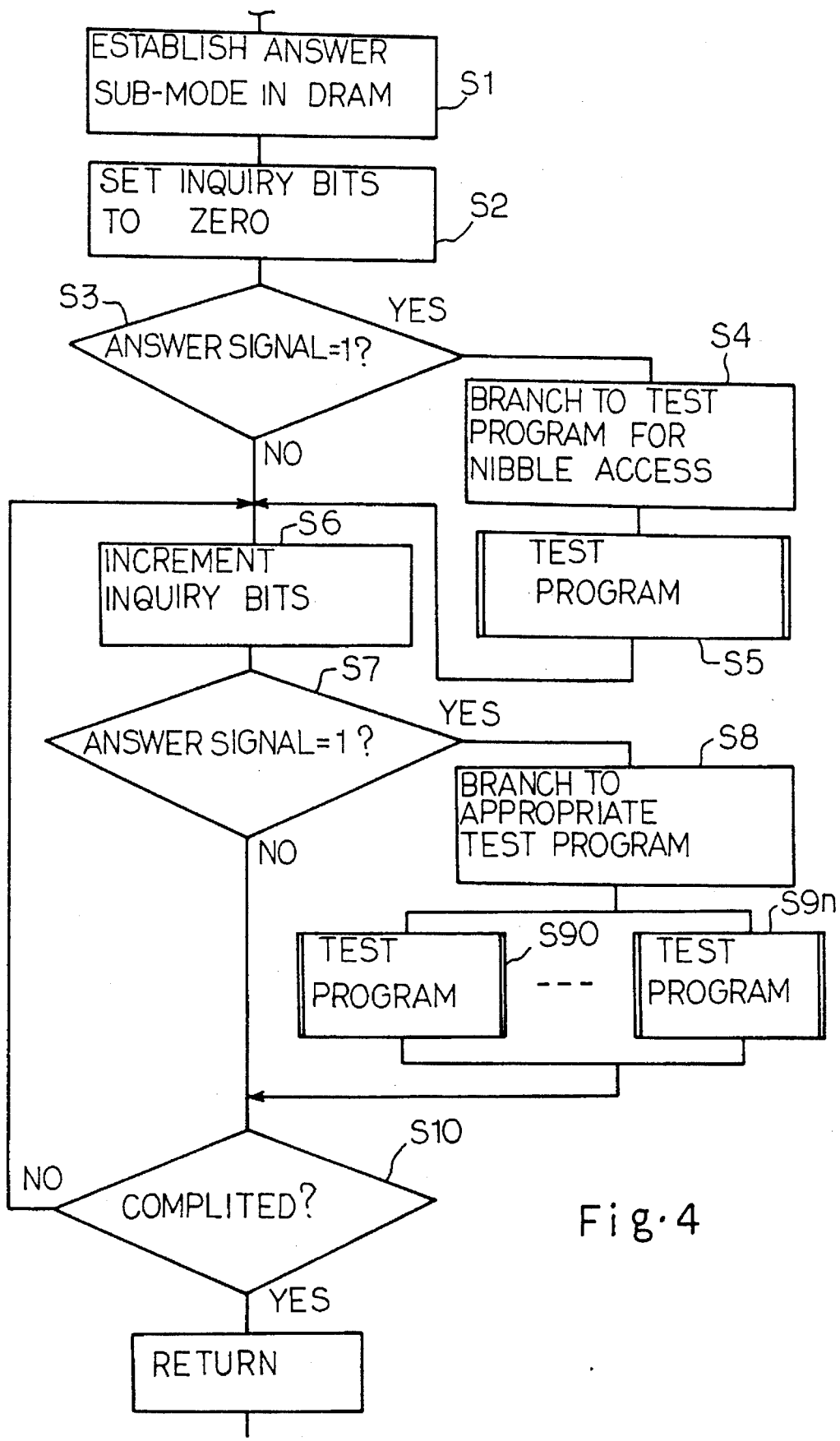
FIG. 4 is a flow chart showing a program sequence for an answer sub-mode executed by the diagnostic system.
Figure 5:
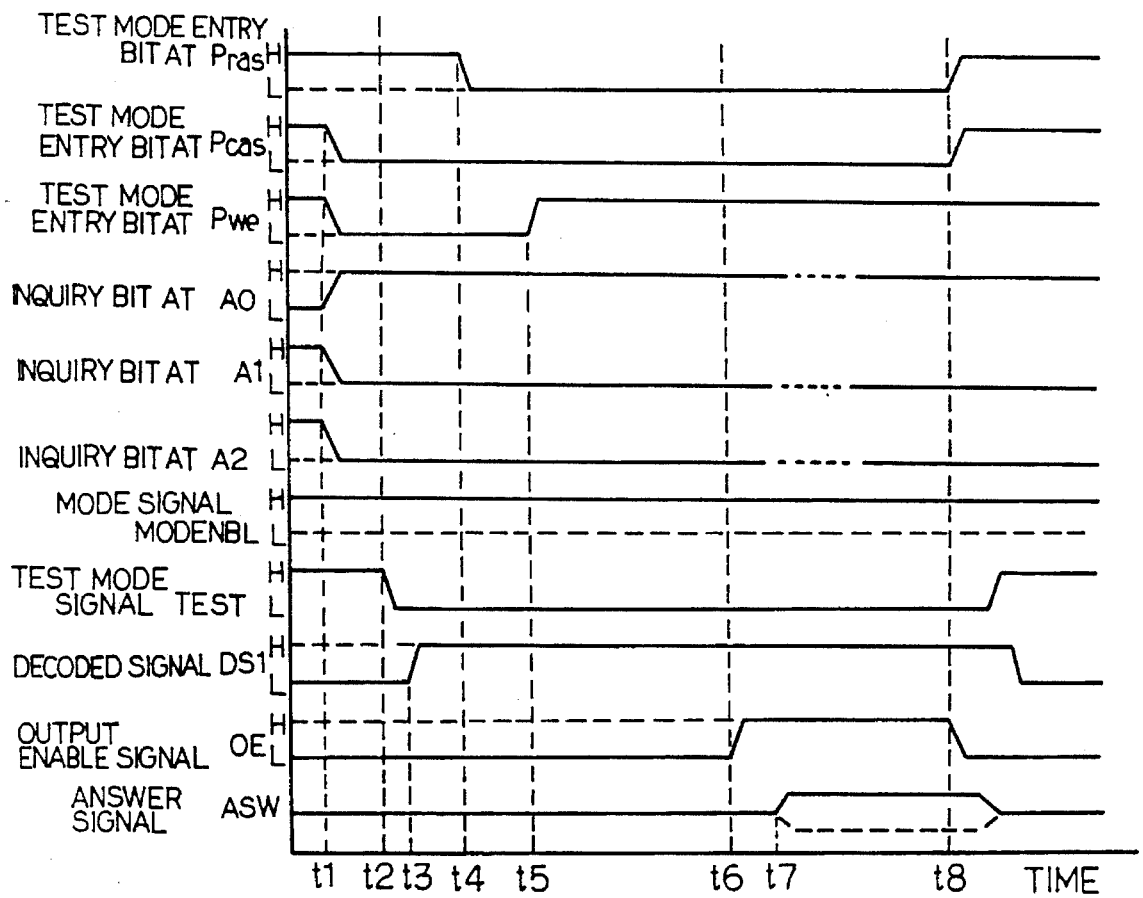
FIG. 5 is a timing chart showing essential signals in the answer sub-mode.

FIG. 4 illustrates the inquiry sub-routine program, and FIG. 5 shows essential signals of the dynamic random access memory device in the diagnostic mode. The diagnostic system 12 starts the test mode entry bits at the control signal pins Pcas and Pwe to go down to the low voltage level at time t1 (see FIG. 5), and further starts the inquiry bit at the address pin A0 to go up to the high voltage level. However, the other inquiry bits at the address pins A1 and A2 are shifted to the low voltage level. The inquiry bits (100) at the address pins A0 to A2 are indicative of the nibble access mode.

The discriminating circuit 11g acknowledges the request for entry into the answer-mode, and produces the acknowledge signal. The acknowledge signal is latched by the flip-flop circuit 11h, and the output inverter 11i and the flip-flop circuit 11h changes the test mode signal TEST and the complementary test mode signal CTEST to the active low voltage level and the high voltage level at time t2 (see FIG. 5), respectively. As a result, the answer sub-mode is established in the dynamic random access memory device.

Thus, the diagnostic system 12 firstly establishes the dynamic random access memory device in the answer sub-mode as by step S1 (see FIG. 4), and sets the inquiry bits to predetermined logic levels indicative of the nibble access mode as by step S2.

The test mode signal TEST of the active low voltage level allows the transfer gates 11j to 1m to turn on, and the inquiry bits at the address bits A0 to A2 are transferred to the decoding circuit 11d. Only the NOR gate NR2 is supplied with logic "0" levels, and changes the decoded signal DS1 to the high voltage level at time t3 (see FIG. 5). The other NOR gates NR3 to NR7 keeps the output nodes thereof in the low voltage level. The diagnostic system 12 changes the test mode entry bit at the control signal pin Pras to the low voltage level at time t4 and the test mode entry bit at the control signal pin Pwe to the high voltage level at time t5.

The decoded signal DS1 of the high voltage level allows the transfer gate 11n to turn on, and the other decoded signal DS2 to DS6 keeps the associated transfer gates 11o to 11s off. As a result, the mode signal MODENBL of the high voltage level is transferred to the output node of the selecting circuit 11e and the inverter INV28.

The complementary test mode signal CTEST causes the selecting circuit 10a to connect the selecting circuit 11e and the inverter INV28 with the logic circuit 10b, and the mode signal MODENBL and the complementary signal thereof reach the NAND gates ND5 and ND6, respectively.

The diagnostic system 12 changes the output enable signal OE to the active high voltage level at time t6 (see FIG. 5), and the NAND gates ND5 and ND6 produce the output signal of the low voltage level and the output signal of the high voltage level. The inverters INV31 and INV32 supply the high voltage signal and the low voltage signal to the n-channel enhancement type switching transistors Qn5 and Qn6, and the n-channel enhancement type switching transistor Qn5 lifts the input and output data pin DP to the high voltage level or logic "1" level at time t7. The high voltage level at the data pin DP is indicative of user's option, i.e., the nibble data access mode, and returns to the diagnostic system 12 as an answer signal of logic "1" level.

Then, the diagnostic system 12 checks the input and output data pin DP to see whether or not the answer signal is logic "1" level as by step S3 (see FIG. 4). In this instance, the answer to step S3 is given affirmative, and the diagnostic system 12 is branched to a test program for the nibble access as by step S4. The diagnostic system 12 carries out the test program as by step S5, and proceeds to step S6. While the diagnostic system 12 is executing the test program, the dynamic random access memory device is examined whether or not data bits in the memory cell array 2 are appropriately read out through the selector 9 to the input and output circuit 10.

In step S6, the diagnostic system S6 increments the inquiry bits IQR, and the inquiry bits (010) are supplied to the address bits A0, A1 and A2. the inquiry signal IQR of (010) is indicative of the static column access mode. However, the user does not select the static column access mode. The decoding circuit 11d decodes the inquiry signal IQR, and changes the decoded signal DS2 to the high voltage level. The decoded signal DS2 allows the transfer gate 11o to turn on, and the mode signal MODESTC of the low voltage level is transferred to the input and output circuit 10. The input and output circuit 10 changes the input and output data pin DP to the low voltage level, and the diagnostic system 12 checks the answer signal to see whether in high voltage level or in the low voltage level as by step S7 (see FIG. 4). The dynamic random access memory device is not accessible through the static column mode, and the answer to step S7 is given negative. Then, the diagnostic system 12 is not branched to step S8 and any one of steps S90 to S9n, but proceeds to step S10.

As step S10, the diagnostic system checks the inquiry bits IQR to see whether or not all the inquiry is completed. While the answer to step S10 is given negative, the diagnostic system 12 returns to step S6, and reiterates the loop consisting of steps S6 to S10 so that all the mode signals MODENBL to MODE4K are examined.

Upon completion of the inquiry, the answer to step S10 is given affirmative, and the diagnostic system 12 shifts the test mode entry bits at the control signal pins Pras and Pcas to the high voltage level at time t8 (see FIG. 5) . As a result, the discriminating circuit 11g causes the test mode signal TEST to the inactive high voltage level, and the dynamic random access memory device escapes from the answer sub-mode.

As will be appreciated from the foregoing description, the answer system 11 incorporated in the dynamic random access memory device informs the diagnostic system 12 of the user's option, and allows the diagnostic system to selectively branch to the appropriate test programs. As a result, the test programs are shared between the models of the dynamic random access memory device, and the manufacturer does not need to tailor a set of computer programs for each model.

Second Embodiment

Figure 6:
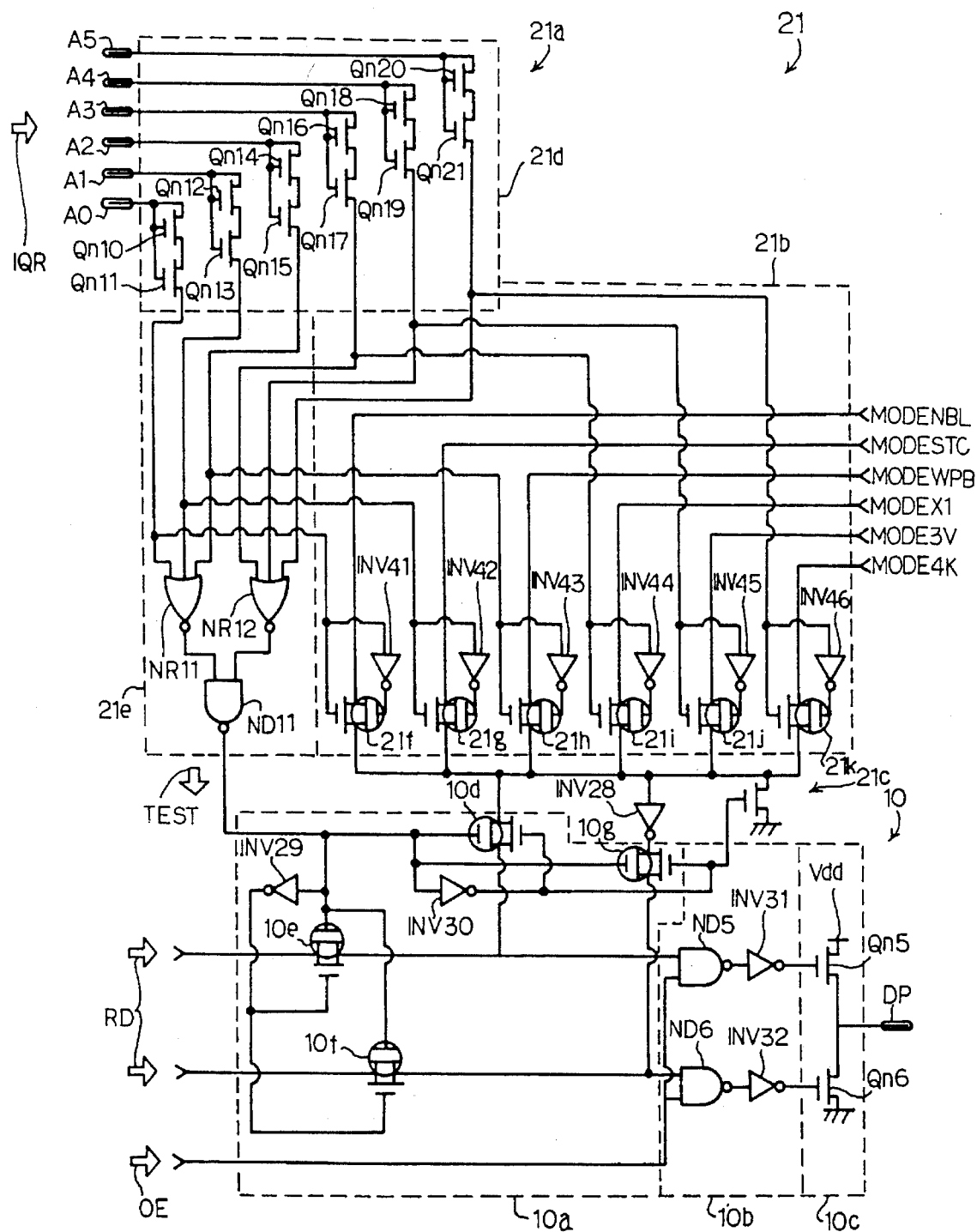
FIG. 6 is a circuit diagram showing the arrangement of an answer system incorporated in another dynamic random access memory device.

Turning to FIG. 6 of the drawings, an answer system 21 is incorporated in another dynamic random access memory device embodying the present invention. However, the other component units are similar to those of the dynamic random access memory device implementing the first embodiment, and description is focused upon the answer system 21 only. When the description requires identification of the other units and the circuit components, the other units and the circuit components are accompanied with the references used for the first embodiment.

The answer system 21 largely comprises a discriminating circuit 21a for shifting the input and output circuit 10 between the read-out data bit RD and the mode signal MODENBL, MODESTC, MODEWPB, MODEX1 , MODE3V or MODE4K, a selecting circuit 21b for selecting the mode signals MODENBL to MODE4K, and a pull-down circuit 21c. In this instance, the inquiry bits IQR are supplied to the address bits A0 to A5, and has a high level twice as high as the high level of the address bits.

The discriminating circuit 21a is broken down into a step-down circuit 21d and a logic circuit 21e. The step-down circuit 21d is implemented by series combinations of n-channel enhancement type load transistors Qn10/Qn11, Qn12/Qn13, Qn14/Qn15, Qn16/Qn17, Qn18/Qn19 and Qn20/Qn21, and the series combinations are coupled between the address pins A0 to A5 and the logic circuit 21e. The logic circuit 21e comprises NOR gates NR11 and NR12 and a NAND gate ND11, and the series combinations selectively supply the step-down inquiry bits to the NOR gates NR11 and NR12.

Even through the address bits at the address pins A0 to A5 are changed between the high voltage level and the low voltage level in the nibble access mode, the step-down circuit 21d supplies only the low level signals to the NOR gates NR11 and NR12, and NOR gates NR11 and NR12 yield logic "1" levels. This results in that the NAND gate ND11 keeps a test signal TEST at the output node thereof in the inactive low voltage level, and the input and output circuit 10 transfers the read-out data bit RD to the logic circuit 10b.

On the other hand, when the inquiry bits IQR are applied to the address pins A0 to A5 in the answer submode, the step-down circuit 21d can change the output signals thereof across the threshold of the NOR gates NR11 and NR12. In this situation, one of the NOR gates NR11 and NR12 produces logic "1" level, and the other of the NOR gates NR11 an NR12 yields logic "0" level. This results in that the NAND gate ND11 changes the test mode signal TEST to the active high voltage level. With the test mode signal TEST of the high voltage level, the selecting circuit 10a couples the selecting circuit 21b and the inverter INV28 with the logic circuit 10b.

The selecting circuit 21b is implemented by transfer gates 21f to 21k and inverters INV41 to INV46, and the transfer gates 21f to 21k and the inverters INV41 to INV46 are coupled with the n-channel enhancement type load transistors Qn13, Qn15, Qn17, Qn19 and Qn21. The mode signals MODENBL, MODESTC, MODEWPB, MODEX1, MODE3V and MODE4K are respectively supplied to the transfer gates 21f to 21k, and the step-down circuit 21d allows the inquiry bits of the high level to exceed the threshold of the inverters INV41 and the threshold of the transfer gates 21f to 21k.

In the answer sub-mode, the diagnostic system 12 changes one of the inquiry bits IQR to the high level, and leaves the other inquiry bits in the low level. The logic circuit 21e causes the selecting circuit 10a to couple the transfer gates 21f to 21k and the inverter INV28 with the logic circuit 10b, and one of the transfer gates 21f to 21k transfers the associated mode signal to the logic circuit 10b. For example, if the inquiry bit at the address pin A0 is shifted to the high level, the transfer gate 21f transfers the mode signal MODENBL indicative of the nibble access mode to the logic circuit 10b, and the logic circuit 10b causes one of the n-channel enhancement type switching transistors Qn5 and Qn6 to turn on, thereby supplying the answer signal to the input and output pin DP.

As will be appreciated from the foregoing description, the answer system 21 also informs the user's option in response to the inquiry of the diagnostic system 12, and allows the diagnostic system to branch to appropriate test programs. Moreover, the answer system 21 is smaller in circuit component than the answer system 11 of the first embodiment.

Although particular embodiments of the present invention have been shown and described, it will be obvious to those skilled in the art that various changes and modifications may be made without departing from the spirit and scope of the present invention. For example, the built-in diagnostic system may be incorporated in a large scale integration having various models different in functions.

What is claimed is:

1. A semiconductor integrated circuit device fabricated on a single semiconductor chip and selectively entering into a standard mode and a diagnostic mode, comprising:

a) a main functional circuitry for achieving tasks through one of optional sub-modes of said standard mode of operation selected by a user, said main functional circuitry being subjected to a test operation in said diagnostic mode;

b) a signal source operative to fix mode signals respectively indicative of said optional sub-modes of operation selectively to an active level representative of selection of said user and an inactive level representative of non-selection of said user, the mode signal of said active level establishing the optional sub-mode selected by said user in said main functional circuitry; and c) an answer system enabled in said diagnostic mode, and responsive to an inquiry signal from a diagnostic system for sequentially supplying said mode signals to said diagnostic system.

2. The semiconductor integrated circuit device as set forth in claim 1, in which said main functional circuitry has a-1) a memory cell array for storing data bits, a-2) a control signal buffer unit for storing external control signals in said standard mode and a multi-bit test mode entry signal in said diagnostic mode, a-3) a nibble accessing means enabled with one of said mode signals for allowing an external device to access said data bits in said memory cell in a nibble fashion, a-4) an addressing means having address pins, and responsive to address signals supplied to said address pins for making said data bits in said memory cell array selectively accessible in said standard mode, said addressing means being further operative to transfer said inquiry signal from said address pins to said answer system, and a-5) a data propagating system coupled between said memory cell array and an output data port in cooperation with said addressing means and said nibble accessing means, and having an output means operative to selectively transfer data bits read-out from said memory cell array and said mode signals to said output data port.

3. The semiconductor integrated circuit device as set forth in claim 1, in which said signal source is implemented by a plurality of idle pads selectively coupled with two power voltage lines for producing said mode signals.

4. The semiconductor integrated circuit device as set forth in claim 2, in which said answer system comprises c-1) a discriminating circuit responsive to said multi-bit test mode entry signal for producing a test mode signal in an answer sub-mode of said diagnostic mode, c-2) a transferring circuit coupled with said address pins, and enabled with said test mode signal for allowing said inquiry signal to pass therethrough, c-3) a decoding circuit responsive to said inquiry signal in said answer sub-mode for changing one of decoded signals to an active level, c-4) a resetting circuit disabled with said test mode signal, and enabled in the absence of said test mode signal for resetting said decoding circuit, and c-5) a selecting circuit coupled with said signal source, and responsive to said one of said decoded signals for transferring one of said mode signals to said output means, said output means being responsive to said test mode signal for transferring said one of said mode signals to said output data port, said output means transferring said data bits to said output data port in the absence of said test mode signal.

5. The semiconductor integrated circuit device as set forth in claim 1, in which said main functional circuitry has a-1) a memory cell array for storing data bits, a-2) a control signal buffer unit for storing external control signals in said standard mode, a-3) a nibble accessing means enabled with one of said mode signals for allowing an external device to access said data bits in said memory cell in a nibble fashion, a-4) an addressing means having address pins, and responsive to address signals supplied to said address pins for making said data bits in said memory cell array selectively accessible in said standard mode, said addressing means being further operative to transfer said inquiry signal from said address pins to said answer system, and a-5) a data propagating system coupled between said memory cell array and an output data port in cooperation with said addressing means and said nibble accessing means, and having an output means operative to selectively transfer data bits read-out from said memory cell array and said mode signals to said output data port.

6. The semiconductor integrated circuit device as set forth in claim 5, in which said inquiry signal is changed between an extremely high voltage level and a low voltage level, said extremely high voltage level being higher than a high voltage level of said address signals, said answer system comprising c-1) a step-down circuit coupled with said address pins, and decreasing the high voltage level of said address signals and the extremely high voltage level of said inquiry signal, c-2) a logic circuit coupled with said step-down circuit for producing a test mode signal from said inquiry signal, said logic circuit being irresponsive to said address signals supplied through said step-down circuit, and c-3) a selecting circuit coupled with said signal source, and responsive to said inquiry signal supplied through said step-down circuit for transferring one of said mode signals to said output means, said output means being responsive to said test mode signal for transferring said one of said mode signals to said output data port, said output means transferring said data bits to said output data port in the absence of said test mode signal.

* * * * *

UNITED STATES PATENT AND TRADEMARK OFFICE
CERTIFICATE OF CORRECTION

PATENT NO.    : 5,487,042
DATED         : January 23, 1996
INVENTOR(S)   : Yasuhiro EDO It is certified that error(s) appears in the above-identified patent and that said Letters Patent is hereby corrected as shown below:

Col. 5, line 32, delete "EQR", insert --IQR--.

Signed and Sealed this

Second Day of July, 1996

*Attest:*

BRUCE LEHMAN

*Attesting Officer*    Commissioner of Patents and Trademarks